US012516752B2

(12) United States Patent
Bauchart et al.

(10) Patent No.: US 12,516,752 B2
(45) Date of Patent: Jan. 6, 2026

(54) SCISSOR STRUCTURE FOR CABLE/TUBE MANAGEMENT OF RACK-MOUNTED LIQUID-COOLED ELECTRONIC ASSEMBLIES

(71) Applicant: OVH, Roubaix (FR)

(72) Inventors: Gregory Francis Louis Bauchart, Wattrelos (FR); Alexandre Alain Jean-Pierre Meneboo, Harnes (FR); Ali Chehade, Moncheaux (FR)

(73) Assignee: OVH, Roubaix (FR)

( * ) Notice: Subject to any disclaimer, the term of this patent is extended or adjusted under 35 U.S.C. 154(b) by 129 days.

(21) Appl. No.: 18/373,555

(22) Filed: Sep. 27, 2023

(65) Prior Publication Data

US 2024/0026996 A1    Jan. 25, 2024

Related U.S. Application Data

(63) Continuation of application No. PCT/IB2022/052977, filed on Mar. 30, 2022.

(30) Foreign Application Priority Data

Apr. 1, 2021   (EP) ..................................... 21305427
Aug. 30, 2021  (EP) ..................................... 21306170

(51) Int. Cl.
*F16L 3/20*      (2006.01)
*F16L 3/237*     (2006.01)
(Continued)

(52) U.S. Cl.
CPC ................. *F16L 3/20* (2013.01); *F16L 3/237* (2013.01); *F16L 3/26* (2013.01); *H05K 5/0226* (2013.01)

(58) Field of Classification Search
CPC .... F16L 3/20; F16L 3/237; F16L 3/26; H05K 5/0226; H05K 7/20236; H05K 7/20254;
(Continued)

(56) References Cited

U.S. PATENT DOCUMENTS 2,115,501 A    4/1938  Sergius
2,316,296 A    4/1943  Simonds
(Continued)

FOREIGN PATENT DOCUMENTS

CN    201898432 U    7/2011
CN    103687443 A    3/2014
(Continued)

OTHER PUBLICATIONS

Office Action with regard to the counterpart CN Patent Application No. 2022103478109 issued Aug. 30, 2024.
(Continued)

Primary Examiner — Muhammad Ijaz
(74) Attorney, Agent, or Firm — BCF LLP

(57) ABSTRACT

The disclosed systems and structures are directed to the management of cable/tube bundles for rack-mounted liquid-cooled cases containing electronic assemblies. The management of cable/tube bundles comprises an articulating scissor structure containing a first arm detachably connected to a contact point on a backplane of a rack-mounted immersion case, a second arm detachably connected to a contact point on a backplane of a rack frame, and a joining portion connecting the first and second arms via a center axle and controllably guiding the cable/tube bundles along a pivot point of the central axle. During the de-racking of the immersion case, the articulating scissor structure is configured to laterally extend and support and guide the cable/tube bundle across a de-racked space, and during the racking of the immersion case, the articulating scissor structure is (Continued)

configured to laterally contract and guide the corresponding cable/tube bundle into a fixed racked space.

18 Claims, 7 Drawing Sheets

(51) Int. Cl.
*F16L 3/26* (2006.01)
*H05K 5/02* (2006.01)

(58) Field of Classification Search
CPC .......... H05K 7/20772; H05K 7/20781; H05K 7/1491
USPC .......................................................... 248/70
See application file for complete search history.

(56) References Cited

U.S. PATENT DOCUMENTS

| | | | |
|---|---|---|---|
| 3,938,689 | A | 2/1976 | de Munnik |
| 4,279,966 | A | 7/1981 | Wakana et al. |
| 4,619,316 | A | 10/1986 | Nakayama et al. |
| 4,888,664 | A | 12/1989 | Rojc |
| 5,268,814 | A | 12/1993 | Yakubowski |
| 5,307,956 | A | 5/1994 | Richter et al. |
| 5,669,524 | A | 9/1997 | Loedel |
| 5,907,473 | A | 5/1999 | Przilas et al. |
| 6,023,934 | A | 2/2000 | Gold |
| 6,746,388 | B2 | 6/2004 | Edwards et al. |
| 6,847,525 | B1 | 1/2005 | Smith et al. |
| 6,883,593 | B2 | 4/2005 | Johnson et al. |
| 6,899,164 | B1 | 5/2005 | Li et al. |
| 6,931,834 | B2 | 8/2005 | Jones |
| 7,369,410 | B2 | 5/2008 | Chen et al. |
| 7,403,392 | B2 | 7/2008 | Attlesey et al. |
| 7,414,845 | B2 | 8/2008 | Attlesey et al. |
| 7,472,795 | B2* | 1/2009 | Dubon .................. H02G 3/128 |
| | | | 211/26 |
| 7,527,085 | B2 | 5/2009 | Iijima et al. |
| 7,724,517 | B2 | 5/2010 | Attlesey et al. |
| 7,885,070 | B2 | 2/2011 | Campbell et al. |
| 7,900,796 | B2 | 3/2011 | Ungrady et al. |
| 7,905,106 | B2 | 3/2011 | Attlesey |
| 7,911,782 | B2 | 3/2011 | Attlesey et al. |
| 7,911,793 | B2 | 3/2011 | Attlesey |
| 8,009,419 | B2 | 8/2011 | Attlesey et al. |
| 8,014,150 | B2 | 9/2011 | Campbell et al. |
| 8,089,764 | B2 | 1/2012 | Attlesey |
| 8,089,765 | B2 | 1/2012 | Attlesey |
| 8,089,766 | B2 | 1/2012 | Attlesey |
| 8,291,964 | B2 | 10/2012 | Hwang et al. |
| 8,305,759 | B2 | 11/2012 | Attlesey et al. |
| 8,467,189 | B2 | 6/2013 | Attlesey |
| 8,619,425 | B2 | 12/2013 | Campbell et al. |
| 8,654,529 | B2 | 2/2014 | Tufty et al. |
| 8,934,244 | B2 | 1/2015 | Shelnutt et al. |
| 8,953,317 | B2 | 2/2015 | Campbell et al. |
| 9,049,800 | B2 | 6/2015 | Shelnutt et al. |
| 9,051,502 | B2 | 6/2015 | Sedarous et al. |
| 9,086,859 | B2 | 7/2015 | Tufty et al. |
| 9,128,681 | B2 | 9/2015 | Tufty et al. |
| 9,144,179 | B2 | 9/2015 | Shelnutt et al. |
| 9,155,230 | B2 | 10/2015 | Eriksen |
| 9,176,547 | B2 | 11/2015 | Tufty et al. |
| 9,195,282 | B2 | 11/2015 | Shelnutt et al. |
| 9,223,360 | B2 | 12/2015 | Tufty et al. |
| 9,265,173 | B1 | 2/2016 | Jhang et al. |
| 9,328,964 | B2 | 5/2016 | Shelnutt et al. |
| 9,335,802 | B2 | 5/2016 | Shelnutt et al. |
| 9,351,429 | B2 | 5/2016 | Shelnutt et al. |
| 9,382,914 | B1 | 7/2016 | Sharfi |
| 9,426,927 | B2 | 8/2016 | Shafer et al. |
| 9,436,235 | B2 | 9/2016 | Damaraju et al. |
| 9,464,854 | B2 | 10/2016 | Shelnutt et al. |
| 9,529,395 | B2 | 12/2016 | Franz et al. |
| 9,699,938 | B2 | 7/2017 | Shelnutt et al. |
| 9,699,939 | B2 | 7/2017 | Smith |
| 9,717,166 | B2 | 7/2017 | Eriksen |
| 9,756,766 | B2 | 9/2017 | Best |
| 9,773,526 | B2 | 9/2017 | Shelnutt et al. |
| 9,781,859 | B1 | 10/2017 | Wishman et al. |
| 9,795,065 | B2 | 10/2017 | Shelnutt et al. |
| 9,801,465 | B1 | 10/2017 | Finch |
| 9,839,164 | B2 | 12/2017 | Shelnutt et al. |
| 9,844,166 | B2 | 12/2017 | Shelnutt et al. |
| 9,861,194 | B1 | 1/2018 | Park |
| 9,872,561 | B1 | 1/2018 | Alfaro |
| 9,921,622 | B2 | 3/2018 | Shelnutt et al. |
| 9,968,010 | B2 | 5/2018 | Shelnutt et al. |
| 9,992,914 | B2 | 6/2018 | Best et al. |
| 10,010,013 | B2 | 6/2018 | Shelnutt et al. |
| 10,018,425 | B2 | 7/2018 | Shelnutt et al. |
| 10,020,242 | B2 | 7/2018 | Katsumata et al. |
| 10,064,314 | B2 | 8/2018 | Shelnutt et al. |
| 10,104,808 | B2 | 10/2018 | Scharinger et al. |
| 10,130,008 | B2 | 11/2018 | Shepard et al. |
| 10,143,113 | B2 | 11/2018 | Shelnutt et al. |
| 10,143,114 | B2 | 11/2018 | Shelnutt et al. |
| 10,146,231 | B2 | 12/2018 | Shelnutt et al. |
| 10,149,408 | B2 | 12/2018 | Fujiwara et al. |
| 10,156,873 | B2 | 12/2018 | Shelnutt et al. |
| 10,172,262 | B2 | 1/2019 | Shelnutt et al. |
| 10,206,312 | B2 | 2/2019 | Shelnutt et al. |
| 10,212,857 | B2 | 2/2019 | Eriksen |
| 10,225,958 | B1 | 3/2019 | Gao |
| 10,238,010 | B2 | 3/2019 | Shelnutt et al. |
| 10,271,456 | B2 | 4/2019 | Tufty et al. |
| 10,321,609 | B2 | 6/2019 | Hirai et al. |
| 10,331,144 | B2 | 6/2019 | Shelnutt et al. |
| 10,399,190 | B2 | 9/2019 | North et al. |
| 10,542,635 | B2 | 1/2020 | Nishiyama |
| 10,598,441 | B2 | 3/2020 | Kawabata et al. |
| 10,617,042 | B2 | 4/2020 | Shelnutt et al. |
| 10,622,283 | B2 | 4/2020 | Leobandung |
| 10,624,236 | B2 | 4/2020 | Inano et al. |
| 10,624,242 | B2 | 4/2020 | Best |
| 10,638,641 | B2 | 4/2020 | Franz et al. |
| 10,645,841 | B1 | 5/2020 | Mao et al. |
| 10,653,036 | B1 | 5/2020 | Gao |
| 10,667,434 | B1 | 5/2020 | Mao et al. |
| 10,674,641 | B2 | 6/2020 | Shepard et al. |
| 10,716,238 | B2 | 7/2020 | Brink |
| 10,729,039 | B2 | 7/2020 | Shelnutt et al. |
| 10,791,647 | B1 | 9/2020 | Miyamura et al. |
| 10,809,011 | B2 | 10/2020 | Chu et al. |
| 10,871,807 | B2 | 12/2020 | Best et al. |
| 10,881,019 | B2 | 12/2020 | Fujiwara et al. |
| 10,888,032 | B2 | 1/2021 | Wakino et al. |
| 10,917,998 | B2 | 2/2021 | Shelnutt et al. |
| 10,932,390 | B2 | 2/2021 | Korikawa |
| 10,939,580 | B2 | 3/2021 | Gao |
| 10,939,581 | B1 | 3/2021 | Chen et al. |
| 10,990,144 | B2 | 4/2021 | Wang et al. |
| 11,006,547 | B2 | 5/2021 | Gao |
| 11,032,939 | B2 | 6/2021 | Tufty et al. |
| 11,071,238 | B2 | 7/2021 | Edmunds et al. |
| 11,107,749 | B2 | 8/2021 | Taniguchi et al. |
| 11,184,997 | B2 | 11/2021 | Broderick et al. |
| 11,268,739 | B2 | 3/2022 | Wang et al. |
| 11,572,614 | B2 | 2/2023 | Sakamoto et al. |
| 11,751,359 | B2 | 9/2023 | Heydari |
| 11,822,398 | B2 | 11/2023 | Heydari |
| 11,837,830 | B2* | 12/2023 | Crighton .............. H05K 7/1492 |
| 11,882,670 | B2 | 1/2024 | Gao |
| 2002/0159233 | A1 | 10/2002 | Patel et al. |
| 2004/0244947 | A1 | 12/2004 | Chen |
| 2005/0145582 | A1* | 7/2005 | Dubon ................. H05K 7/1491 |
| | | | 361/826 |
| 2005/0150637 | A1 | 7/2005 | Tan et al. |
| 2005/0248922 | A1 | 11/2005 | Chu et al. |
| 2007/0025081 | A1 | 2/2007 | Berlin et al. |
| 2007/0227756 | A1* | 10/2007 | Doerr .................. H05K 7/1491 |
| | | | 174/69 |
| 2009/0146294 | A1 | 6/2009 | Hillman et al. |

(56) References Cited

U.S. PATENT DOCUMENTS

| | | |
|---|---|---|
| 2009/0205590 A1 | 8/2009 | Vetrovec |
| 2009/0260777 A1 | 10/2009 | Attlesey |
| 2010/0103620 A1 | 4/2010 | Campbell et al. |
| 2010/0108292 A1 | 5/2010 | Bhunia et al. |
| 2010/0118494 A1 | 5/2010 | Campbell et al. |
| 2010/0170657 A1 | 7/2010 | Kaslusky |
| 2010/0328889 A1 | 12/2010 | Campbell et al. |
| 2011/0026776 A1 | 2/2011 | Liang et al. |
| 2011/0028617 A1 | 2/2011 | Hill et al. |
| 2011/0267768 A1 | 11/2011 | Attlesey |
| 2011/0284194 A1 | 11/2011 | Sarkar et al. |
| 2011/0286177 A1 | 11/2011 | Attlesey |
| 2011/0317367 A1 | 12/2011 | Campbell et al. |
| 2012/0007579 A1 | 1/2012 | Apblett et al. |
| 2012/0014064 A1 | 1/2012 | St. Rock et al. |
| 2012/0058588 A1 | 3/2012 | Mayer et al. |
| 2012/0075797 A1 | 3/2012 | Attlesey |
| 2012/0120599 A1 | 5/2012 | Chua et al. |
| 2012/0193068 A1 | 8/2012 | Nemesh et al. |
| 2013/0050963 A1* | 2/2013 | Zhou .................. H05K 7/1491 361/752 |
| 2013/0105120 A1 | 5/2013 | Campbell et al. |
| 2013/0312839 A1 | 11/2013 | Shelnutt et al. |
| 2013/0341471 A1* | 12/2013 | Yang .................. H05K 7/1491 248/65 |
| 2014/0123492 A1 | 5/2014 | Campbell et al. |
| 2014/0216688 A1 | 8/2014 | Shelnutt et al. |
| 2014/0218845 A1* | 8/2014 | Peng .................. G11B 33/128 361/679.01 |
| 2014/0218861 A1 | 8/2014 | Shelnutt et al. |
| 2014/0321054 A1 | 10/2014 | Kaefer et al. |
| 2015/0061568 A1 | 3/2015 | Martinez |
| 2015/0109730 A1 | 4/2015 | Campbell et al. |
| 2015/0237767 A1 | 8/2015 | Shedd et al. |
| 2015/0330718 A1 | 11/2015 | Rock et al. |
| 2016/0021793 A1 | 1/2016 | Chen |
| 2016/0120059 A1 | 4/2016 | Shedd et al. |
| 2016/0305565 A1 | 10/2016 | Miller et al. |
| 2016/0330874 A1 | 11/2016 | Sato et al. |
| 2016/0360637 A1 | 12/2016 | Harvilchuck et al. |
| 2016/0366792 A1 | 12/2016 | Smith |
| 2017/0105313 A1 | 4/2017 | Shedd et al. |
| 2017/0127565 A1 | 5/2017 | Campbell et al. |
| 2017/0181328 A1 | 6/2017 | Shelnutt et al. |
| 2017/0241721 A1 | 8/2017 | Liang |
| 2017/0265328 A1 | 9/2017 | Sasaki et al. |
| 2018/0008467 A1 | 1/2018 | Cater et al. |
| 2018/0027695 A1 | 1/2018 | Wakino et al. |
| 2018/0042138 A1 | 2/2018 | Campbell et al. |
| 2018/0070477 A1 | 3/2018 | Saito |
| 2018/0084671 A1 | 3/2018 | Matsumoto et al. |
| 2018/0092243 A1 | 3/2018 | Saito |
| 2018/0153058 A1 | 5/2018 | Hirai et al. |
| 2018/0196484 A1 | 7/2018 | Saito |
| 2018/0246550 A1 | 8/2018 | Inaba et al. |
| 2018/0295745 A1 | 10/2018 | De Meijer et al. |
| 2018/0338388 A1 | 11/2018 | We et al. |
| 2019/0014685 A1 | 1/2019 | So et al. |
| 2019/0090383 A1 | 3/2019 | Tufty et al. |
| 2019/0098796 A1 | 3/2019 | Wakino et al. |
| 2019/0218101 A1 | 7/2019 | Huang et al. |
| 2019/0223324 A1 | 7/2019 | Le et al. |
| 2019/0297747 A1 | 9/2019 | Wakino et al. |
| 2020/0025451 A1 | 1/2020 | Stone et al. |
| 2020/0093037 A1 | 3/2020 | Enright et al. |
| 2020/0095667 A1 | 3/2020 | Sakamoto et al. |
| 2020/0150731 A1 | 5/2020 | Wang et al. |
| 2020/0196489 A1 | 6/2020 | Chang et al. |
| 2020/0214169 A1 | 7/2020 | Tsunoda |
| 2020/0267872 A1 | 8/2020 | Harada et al. |
| 2020/0288600 A1 | 9/2020 | Gao |
| 2020/0305307 A1 | 9/2020 | Amos et al. |
| 2020/0323100 A1 | 10/2020 | Chiu et al. |
| 2020/0323108 A1 | 10/2020 | Bilan et al. |
| 2020/0389998 A1 | 12/2020 | Tung et al. |
| 2020/0390007 A1 | 12/2020 | Edmunds et al. |
| 2021/0051815 A1 | 2/2021 | Van et al. |
| 2021/0076531 A1 | 3/2021 | Tung et al. |
| 2021/0102294 A1 | 4/2021 | Miljkovic et al. |
| 2021/0112683 A1 | 4/2021 | Mohajer et al. |
| 2021/0185850 A1 | 6/2021 | Kulkarni et al. |
| 2021/0321526 A1 | 10/2021 | Kulkarni et al. |
| 2021/0327787 A1 | 10/2021 | Yang et al. |
| 2021/0385971 A1 | 12/2021 | Gorius et al. |
| 2021/0410292 A1 | 12/2021 | Yang et al. |
| 2021/0410319 A1 | 12/2021 | Manousakis et al. |
| 2021/0410320 A1 | 12/2021 | Yang et al. |
| 2021/0410328 A1 | 12/2021 | Yang et al. |
| 2022/0256744 A1 | 8/2022 | Le et al. |
| 2023/0059446 A1 | 2/2023 | Gao |
| 2024/0152163 A1 | 5/2024 | Heger et al. |
| 2025/0194044 A1 | 6/2025 | Chehade et al. |

FOREIGN PATENT DOCUMENTS

| | | |
|---|---|---|
| CN | 106681459 A | 5/2017 |
| CN | 107643813 A | 1/2018 |
| CN | 110691490 A | 1/2020 |
| CN | 210630126 U | 5/2020 |
| CN | 211184672 U | 8/2020 |
| CN | 110430725 B | 2/2021 |
| EP | 2321849 A1 | 5/2011 |
| EP | 2331412 B1 | 9/2012 |
| EP | 3236727 A2 | 10/2017 |
| EP | 3249496 A1 | 11/2017 |
| EP | 3236727 A3 | 1/2018 |
| EP | 3346491 A1 | 7/2018 |
| EP | 3402316 A1 | 11/2018 |
| EP | 3731611 A1 | 10/2020 |
| EP | 3742097 A1 | 11/2020 |
| EP | 2321849 B1 | 1/2022 |
| GB | 2575680 A | 1/2020 |
| GB | 2574632 B | 7/2020 |
| JP | H043451 A | 1/1992 |
| JP | 2000092819 A | 3/2000 |
| JP | 2020065002 A | 4/2020 |
| NL | 1006486 C2 | 1/1999 |
| TW | I 678 961 B | 12/2019 |
| WO | 2011006150 A1 | 1/2011 |
| WO | 2012162986 A1 | 12/2012 |
| WO | 2014/169230 A1 | 10/2014 |
| WO | 2016076882 A1 | 5/2016 |
| WO | 2017/040217 A1 | 3/2017 |
| WO | 2018025016 A1 | 2/2018 |
| WO | 2018054462 A1 | 3/2018 |
| WO | 2019006437 A1 | 1/2019 |
| WO | 2019060576 A2 | 3/2019 |
| WO | 2019068916 A2 | 4/2019 |
| WO | 2019068916 A3 | 6/2019 |
| WO | 2020/102090 A1 | 5/2020 |
| WO | 2020170079 A1 | 8/2020 |
| WO | 2020/183038 A1 | 9/2020 |
| WO | 2020216954 A1 | 10/2020 |
| WO | 2020/234600 A1 | 11/2020 |
| WO | 2020223806 A1 | 11/2020 |
| WO | 2020254917 A1 | 12/2020 |
| WO | 2021/040841 A1 | 3/2021 |
| WO | 2021161026 A1 | 8/2021 |

OTHER PUBLICATIONS

Office Action with regard to te counterpart U.S. Appl. No. 17/690,839 issued Jun. 25, 2024.

Office Action with regard to te counterpart U.S. Appl. No. 17/698,480 issued Jul. 3, 2024.

Extended European Search Report with regard to the counterpart EP Patent Application No. 22305018.8 completed Jun. 24, 2022.

Office Action with regard to the counterpart U.S. Appl. No. 17/701,422 mailed Mar. 28, 2023.

Notice of Allowance with regard to the counterpart U.S. Appl. No. 17/691,494 mailed Apr. 17, 2023.

Office Action with regard to the counterpart U.S. Appl. No. 17/697,452 mailed May 11, 2023.

(56) References Cited

OTHER PUBLICATIONS

Office Action with regard to the counterpart U.S. Appl. No. 17/698,480 mailed Sep. 7, 2023.
Office Action with regard to the counterpart U.S. Appl. No. 17/697,264 mailed Nov. 22, 2023.
Office Action with regard to the counterpart U.S. Appl. No. 17/697,452 mailed Nov. 22, 2023.
International Search Report and Written Opinion with regard to PCTIB2022053071 mailed Jun. 28, 2022.
International Search Report and Written Opinion with regard to PCT/IB2022/052975 mailed Jun. 20, 2022.
International Search Report and Written Opinion with regard to PCTIB2022052330 mailed May 30, 2022.
International Search Report and Written Opinion with regard to PCT/IB2022/052976 mailed Jun. 17, 2022.
International Search Report and Written Opinion with regard to PCT/IB2022/052977 mailed Jun. 20, 2022.
European Search Report with regard to EP21306170.8 completed Feb. 12, 2022.
European Search Report with regard to EP21306189.8 completed Feb. 10, 2022.
Office Action with regard to te counterpart CN Patent Application No. 2022103375051 issued May 11, 2024.
Office Action with regard to the counterpart U.S. Appl. No. 17/694,765 mailed Dec. 21, 2023.
Office Action with regard to the counterpart U.S. Appl. No. 17/698,037 mailed Feb. 26, 2024.
Office Action with regard to the counterpart U.S. Appl. No. 17/697,616 mailed Feb. 26, 2024.
Notice of Allowance with regard to the counterpart U.S. Appl. No. 17/690,839 mailed Mar. 5, 2024.
Notice of Allowance with regard to te counterpart U.S. Appl. No. 17/697,616 issued Jul. 23, 2024.
Office Action with regard to the counterpart U.S. Appl. No. 17/690,833 mailed Mar. 28, 2024.
Office Action with regard to the counterpart U.S. Appl. No. 17/697,452 mailed Mar. 25, 2024.
Office Action with regard to te counterpart CN Patent Application No. 2022103326074 issued Jul. 29, 2024.
Office Action with regard to the counterpart CN Patent Application No. 2022103375314 issued Aug. 12, 2024.
Notice of Allowance with regard to the counterpart U.S. Appl. No. 17/707,200 issued Aug. 15, 2024.

"HP Expands Workstation Series to Include Desk-side, Mobile and Small Form Factor Mode", TechPowerUp, Mar. 24, 2010, https://www.techpowerup.com/118323/hp-expands-workstation-series-to-include-desk-side-mobile-and-small-form-factor-mode, retrieved on Jul. 19, 2021, 6 pages.
"IBM's Hot-Water Supercomputer Goes Live", Data Center Knowledge, retrieved on Jul. 19, 2021, 9 pages.
Extended European Search Report with regard to the EP Patent Application No. 21306771.3 completed May 23, 2022.
Extended European Search Report with regard to the EP Patent Application No. 21306173.2 completed Feb. 18, 2022.
Extended European Search Report with regard to the EP Patent Application No. 21306174.0 completed Feb. 14, 2022.
Extended European Search Report with regard to the EP Patent Application No. 21306172.4 completed Feb. 15, 2022.
English Abstract for JP2020065002 retrieved on Espacenet on Jun. 2, 2022.
Extended European Search Report with regard to the EP Patent Application No. 21306186.4 completed Feb. 10, 2022.
Extended European Search Report with regard to the EP Patent Application No. 21306187.2 completed Feb. 10, 2022.
Extended European Search Report with regard to the EP Patent Application No. 21306175.7 completed Apr. 8, 2022.
Extended European Search Report with regard to the EP Patent Application No. 21306188.0 completed Feb. 10, 2022.
English Abstract for JPH043451 retrieved on Feb. 22, 2022.
Extended European Search Report with regard to the EP Patent Application No. 21306171.6 completed Feb. 11, 2022.
Extended European Search Report with regard to the EP Patent Application No. 21306189.8 completed Feb. 10, 2022.
Extended European Search Report with regard to the EP Patent Application No. 21306170.8 completed Feb. 12, 2022.
English Abstract for NL1006486 retrieved on Espacenet on Jun. 3, 2022.
Office Action with regard to the counterpart U.S. Appl. No. 17/697,452 issued Sep. 6, 2024.
Office Action with regard to the counterpart U.S. Appl. No. 18/373,539 issued Jul. 10, 2025.
Office Action with regard to the counterpart U.S. Appl. No. 18/373,567 issued Jul. 18, 2025.
Notice of Allowance with regard to the counterpart U.S. Appl. No. 18/373,543 issued Oct. 21, 2025.

\* cited by examiner

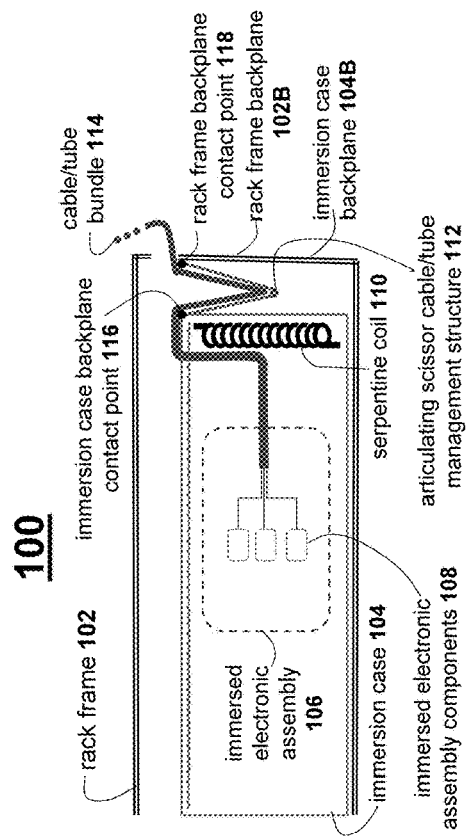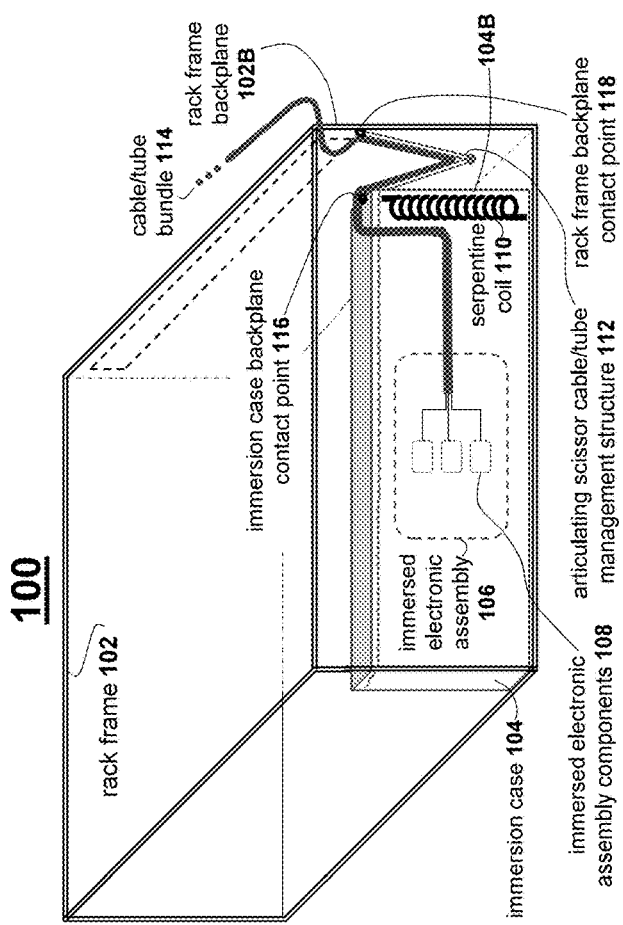

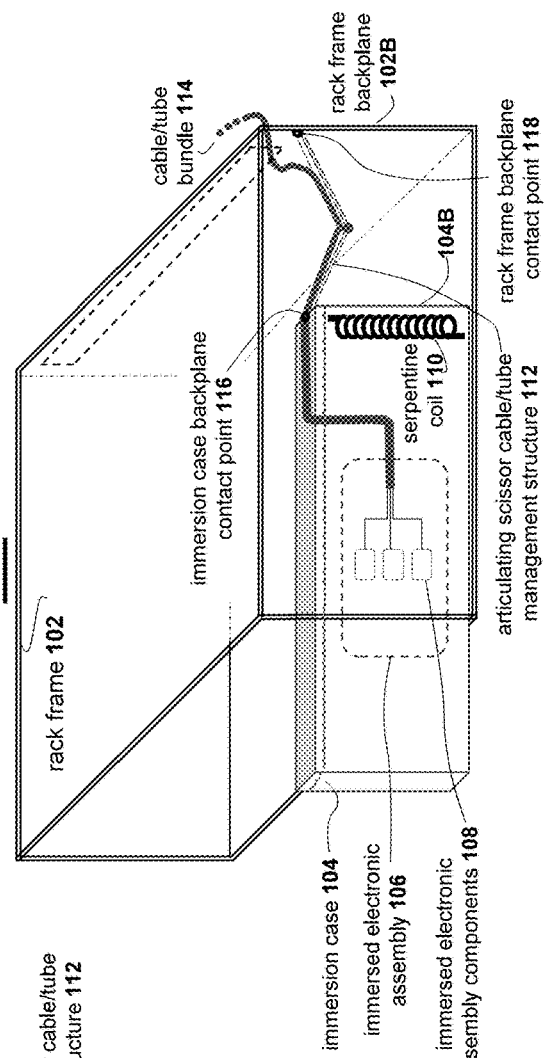
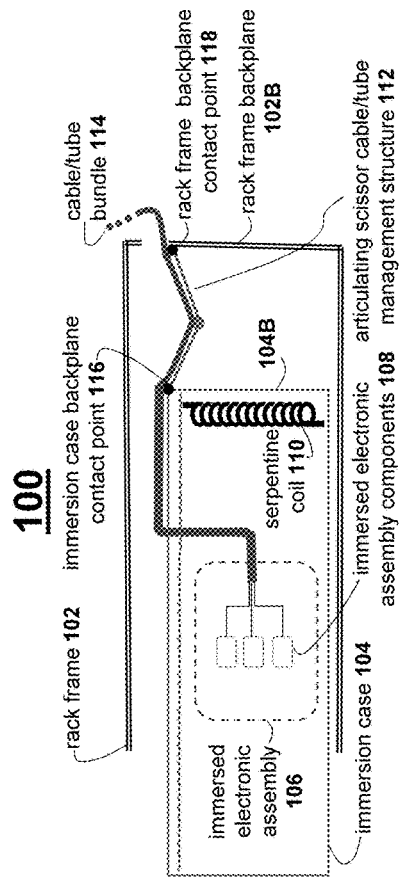

SCISSOR STRUCTURE FOR CABLE/TUBE MANAGEMENT OF RACK-MOUNTED LIQUID-COOLED ELECTRONIC ASSEMBLIES

CROSS-REFERENCE TO RELATED APPLICATIONS

The present patent application is a continuation of PCT Application PCT/IB2022/052977 filed on Mar. 30, 2022, claiming priority to European Appln. No. EP 21305427.3, entitled "IMMERSION COOLING CONCEPTS FOR SERVERS", filed on Apr. 1, 2021, along with European Appln. No. EP 21306170.8, entitled "SCISSOR STRUCTURE FOR CABLE/TUBE MANAGEMENT OF RACK-MOUNTED LIQUID-COOLED ELECTRONIC ASSEMBLIES", filed on Aug. 30, 2021, in which the contents of all noted applications are herein incorporated by reference in their entireties.

FIELD

The present disclosure generally relates to rack-mounted, liquid-cooled electronic equipment and, in particular, to the management of cables and flexible tubes servicing rack-mounted, liquid-cooled electronic equipment.

BACKGROUND

Large computing facilities endeavor to keep up with the market demand for increased processing resources. Such facilities may, therefore, implement a large number of rack systems configured to support thousands or even tens of thousands of electronic processing assemblies to accommodate the market demand.

It will be appreciated that such a multitude of racked electronic processing assemblies consume large amounts of power and, in turn, generate substantial amounts of heat that needs to be controlled in order to ensure proper processing performance. Various heat mitigation measures, such as, for example, liquid-cooling techniques have been implemented to cool the racked electronic processing assemblies to acceptable ambient temperature levels.

Therefore, in addition to the power supply and communication cables, to and from each of the racked electronic processing assemblies, rack systems have to also accommodate related flexible liquid-cooling tubes. The combined cable and tube bundles for each of the serviced racked electronic processing assemblies frequently become unwieldly and difficult to manage during racking and de-racking maintenance operations. As such, there is an interest in managing the cable/tube bundles servicing racked liquid-cooled electronic assemblies.

SUMMARY

The embodiments of the present disclosure have been designed based on the developers' appreciation of the limitations associated with the conventional cable/tube management of rack-mounted liquid-cooled electronic assemblies. In addressing such limitations, the embodiments of the present disclosure provide a rack system for housing a plurality of rack-mounted immersion cases that comprises a rack frame configured to slidably accommodate individual racking and de-racking operations of each of the plurality of immersion cases within the rack system and an opening within the rack frame structure configured to accommodate a plurality of cable/tube bundles, in which each one of the plurality of cable/tube bundles individually service a corresponding one of the plurality of immersion cases within the rack system.

The rack system further comprises at least one articulating scissor structure comprising a first arm detachably connected to a contact point on the backplane of a corresponding immersion case, a second arm detachably connected to a contact point on a backplane of the rack frame, and a joining portion connecting the first and second arms. The articulating scissor structure is configured to individually guide each one of the cable/tube bundles along a racked space and a de-racked space, the racked and de-racked spaces being defined between a backplane of the corresponding immersion case and a backplane of the rack frame, in which the de-racked space is larger than the racked space.

The rack system further enables, during the de-racking operation of an immersion case (104), the articulating scissor structure to laterally extend and guide the corresponding cable/tube bundle across the de-racked space and, during the racking operation of an immersion case, the corresponding articulating scissor structure is configured to laterally contract and guide the corresponding cable/tube bundle within the racked space.

In certain implementations consistent with the present disclosure, the articulating scissor structure further comprises that each of the first and second arms of the articulating scissor structure contain a flat surface portion and a retaining sidewall portion, the flat surface and retaining sidewall portions of the respective first and second arms configured to complement each other to enable the joining portion to hingedly couple the first and second arms together.

In certain implementations consistent with the present disclosure, the articulating scissor structure also comprises a top portion of the first arm containing a fastener configured to detachably connect to the contact point on the backplane of the corresponding immersion case; a top portion of the second arm containing a fastener configured to detachably connect to a contact point on the backplane of the rack frame; and a bottom portion of the first arm and a bottom portion of the second arm that are connected by the joining portion.

In certain implementations consistent with the present disclosure, the joining portion of the articulating scissor structure controllably guides the cable/tube bundle along a pivot point of the center axle during racking and de-racking operations movement by arranging the cable/tube bundle to loop around the center axle.

In certain implementations consistent with the present disclosure, the joining portion of the articulating scissor structure controllably guides the cable/tube bundle along a pivot point of the center axle during racking and de-racking operations movement by incorporating, proximate to the center axle, first rotatable coupling elements connecting to a segment of the cable/tube bundle routed from the rack frame backplane that are configured to communicate with second rotatable coupling elements connecting to a segment of the cable/tube bundle routed to the immersion case backplane.

In certain implementations consistent with the present disclosure, the joining portion of the articulating scissor structure controllably guides the cable/tube bundle along a pivot point of the center axle during racking and de-racking operations movement by incorporating, proximate to the center axle, a first strain-relief fitting connecting to a segment of the cable/tube bundle routed from the rack frame backplane and a second strain-relief fitting connecting to a segment of the cable/tube bundle routed to the immersion case backplane.

BRIEF DESCRIPTION OF THE FIGURES

Further features and advantages of the present disclosure will become apparent from the following detailed description taken in combination with the appended drawings, in which:

FIG. 1A is a cross-sectional view of an immersion case in a racked position serviced by the articulating scissor cable/tube management structure, in accordance with the embodiments of the present disclosure;

FIG. 1B is a perspective view of an immersion case in a racked position serviced by the articulating scissor cable/tube management structure, in accordance with the embodiments of the present disclosure;

FIG. 2A is a cross-sectional view of an immersion case in a de-racked position serviced by the articulating scissor cable/tube management structure, in accordance with the embodiments of the present disclosure;

FIG. 2B is a perspective view of an immersion case in a de-racked position serviced by the articulating scissor cable/tube management structure, in accordance with the embodiments of the present disclosure;

Figure 3A:
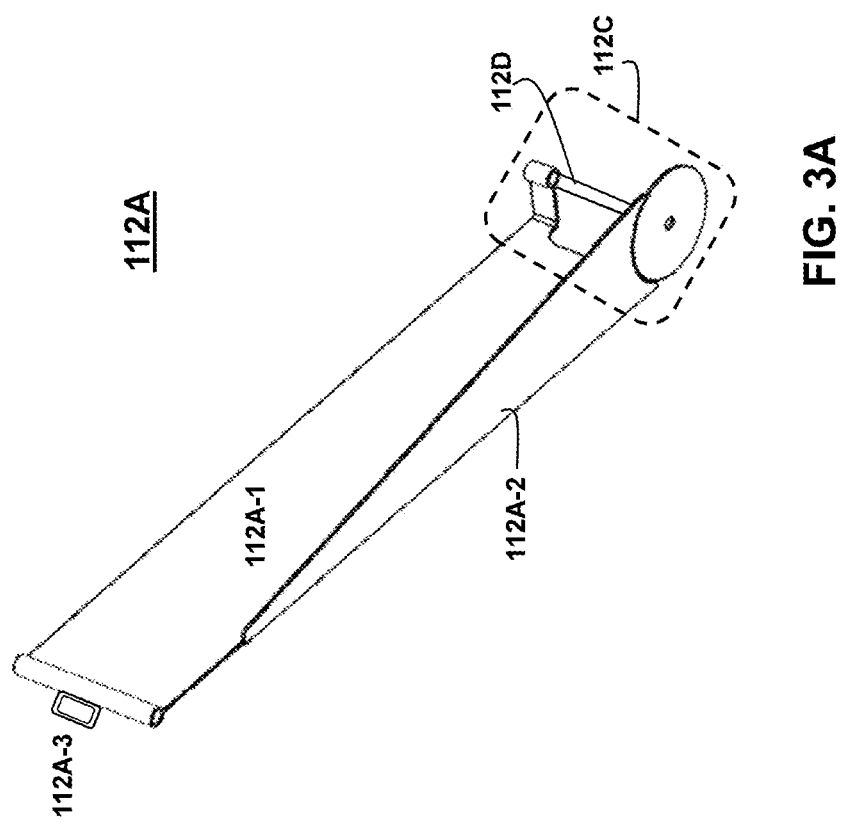
FIG. 3A depicts a perspective view of the features of one of the arms of the articulating scissor cable/tube management structure, in accordance with the embodiments of the present disclosure.

It is to be understood that throughout the appended drawings and corresponding descriptions, like features are identified by like reference characters and that the drawings are not to scale. It should also be understood that the drawings and ensuing descriptions are intended for illustrative purposes only and that such disclosures are not intended to limit the scope of the claims.

DETAILED DESCRIPTION

The present disclosure is directed to addressing at least some of the limitations regarding conventional methods of managing the cable/tube bundles servicing rack-mounted liquid-cooled electronic assemblies.

It will be understood, however, that the examples and conditional language recited herein are principally intended to aid the reader in understanding the principles of the present technology and not to limit its scope to such specifically recited examples and conditions. It will be appreciated that those skilled in the art may devise various arrangements that, although not explicitly described or shown herein, nonetheless embody the principles of the present technology and are included within its spirit and scope.

Furthermore, as an aid to understanding, the following description may describe relatively simplified implementations of the present technology. As persons skilled in the art would understand, various implementations of the present technology may be of a greater complexity. In some cases, what are believed to be helpful examples of modifications to the present technology may also be set forth. This is done merely as an aid to understanding, and, again, not to define the scope or set forth the bounds of the present technology. These modifications are not an exhaustive list, and a person skilled in the art may make other modifications while nonetheless remaining within the scope of the present technology.

Moreover, where no examples of modifications have been set forth, it should not be interpreted that no modifications are possible and/or that what is described is the sole manner of implementing that element of the present technology. As such, all statements herein reciting principles, aspects, and implementations of the present technology, as well as specific examples thereof, are intended to encompass both structural and functional equivalents thereof, whether they are currently known or developed in the future.

It will be appreciated by those skilled in the art that any block diagrams herein represent conceptual views of illustrative circuitry embodying the principles of the present technology. Similarly, it will be appreciated that any flowcharts, flow diagrams, state transition diagrams, pseudocode, and the like represent various processes that may be substantially represented in non-transitory computer-readable media and so executed by a computer or processor, whether or not such computer or processor is explicitly shown.

Similarly, functions of the various elements shown in the figures, including any functional block labeled as a "processor", may be provided through the use of dedicated hardware as well as hardware capable of executing software in association with appropriate software.

With these fundamentals in place, presented heretofore are non-limiting embodiments that illustrate various aspects and implementations of the present disclosure.

In particular, FIGS. 1A and 1B depict a cross-sectional view and perspective view, respectively, of a rack-mounted immersion case in a racked position serviced by the articulating scissor cable/tube management structure, in accordance with the embodiments of the present disclosure. The racked position of the immersion case 104 is applied during installation and real-time operations.

For illustrative purposes and ease of understanding only, the figures depict a single rack-mounted immersion case 104 within a rack system 100. Such depictions should not be interpreted as being limiting, as the inventive concepts presented herein cover and contemplate the use of multiple immersion cases 104 housed by rack system 100.

As shown, rack system 100 comprises a rack frame 102 that houses a rack-mounted, liquid-cooled casing 104 containing at least one electronic assembly 106. As detailed below, the liquid cooling techniques employed to reduce the temperature of the at least one electronic assembly 106 or electronic components thereof, may comprise the use of an immersion dielectric cooling fluid, the use of circulated cooled channelized water to water blocks directly disposed on electronic components, or some combination of the two techniques. For tractability purposes, the description will refer to the rack-mounted, liquid-cooled casing as an immersion case 104 with the understanding that this term is not, in any way, intended to be limiting.

As depicted, immersion case 104 manifests a substantially "book-like" rectangular shape that, in the racked position, is slidably inserted and installed within rack frame 102 of rack system 100. The immersion case 104 may be configured to contain at least one immersed electronic assembly 106 that is fully submerged in dielectric cooling fluid, in which the at least one immersed electronic assembly 106 contains various heat-generating processing components 108.

In some implementations, immersion case 104 may be configured to contain a serpentine convection coil 110 immersed in the dielectric fluid. The serpentine convection coil 110 is configured to cool the ambient temperature of the dielectric cooling fluid caused by the heat-generating processing components 108 through thermal convection.

In some implementations, immersion case 104 may be configured to contain a closed-loop cooled water distribution arrangement configured to circulate cooled channelized water, via a flexible tube network, through serpentine convection coil 110 and through liquid cooling blocks that are directly thermally coupled to processing components 108.

The cables that supply power and communication facilities to the immersed electronic processing assembly 106 along with the flexible tubes channeling cooled water are grouped together to form a cable/tube bundle 114 to service the corresponding immersion case 104. The routing of cable/tube bundle 114 to the corresponding immersion case 104 is accommodated via an opening in rack frame 102.

As shown, the backplane 104B of immersion case 104 incorporates an immersion case contact point 116 and the backplane 102B of the rack frame 102 incorporates a rack frame contact point 118. As discussed in detail below, these contact points 116, 118 operate to engage complimentary elements of an articulating scissor cable/tube structure 112 that manages cable/tube bundle 114. As such, immersion case contact point 116 and rack frame contact point 118 may comprise a protrusion, stud, stem, hole or similar elements to detachably mate with complimentary articulating scissor cable/tube structure 112 elements.

As also shown, while immersion case 104 is in the racked position, there exists a fixed lateral distance spacing between the backplane 104B of immersion case 104 and the backplane 102B of the rack frame 102. This fixed lateral distance spacing defines a racked space. The racked space is configured to accommodate the housing of cable/tube bundle 114 of the corresponding immersion case 104 while in the racked position. In order to manage cable/tube bundle 114 of the corresponding immersion case 104, articulating scissor cable/tube structure 112 is presented. The articulating scissor cable/tube structure 112 is configured to support and guide cable/tube bundle 114 into the racked space and maintain orderly control of cable/tube bundle 114.

FIG. 3A depicts a perspective view of the features of one of the arms of articulating scissor cable/tube structure 112, in accordance with the embodiments of the present disclosure. For simplicity, only first arm 112A is depicted. It should be understood that the structural features of first arm 112A are also incorporated by second arm 112B in a complementary mirror image manner for the construction of scissor cable/tube structure 112.

As shown by FIG. 3A, first arm 112A comprises flat surface portion 112A-1 configured to receive and accommodate cable/tube bundle 114 and a retaining sidewall portion 112A-2 configured to restrict the cable/tube bundle 114 from laterally spilling over. First arm 112A further comprises a joining portion 112C configured to hingedly mate with a joining portion of the second arm 112B of the scissor cable/tube structure 112 via a center axle 112D. The joining portion 112C may also include a flexible spring structure (not shown) to bias arms 112A,B towards each other or away from each other. First arm 112A also incorporates a fastener 112A-3 disposed at a top portion thereof and is configured to detachably connect to the immersion case backplane 104B (i.e., contact point 116).

The articulating scissor cable/tube structure 112 may be constructed from a metal, plastic, rubber or any other suitable material. Moreover, articulating scissor cable/tube structure 112 may be constructed as a unitary component that is formed, pressed, or molded. Alternatively, articulating scissor cable/tube structure 112 may be constructed as an integrated assembly of individual components.

Figure 3B:
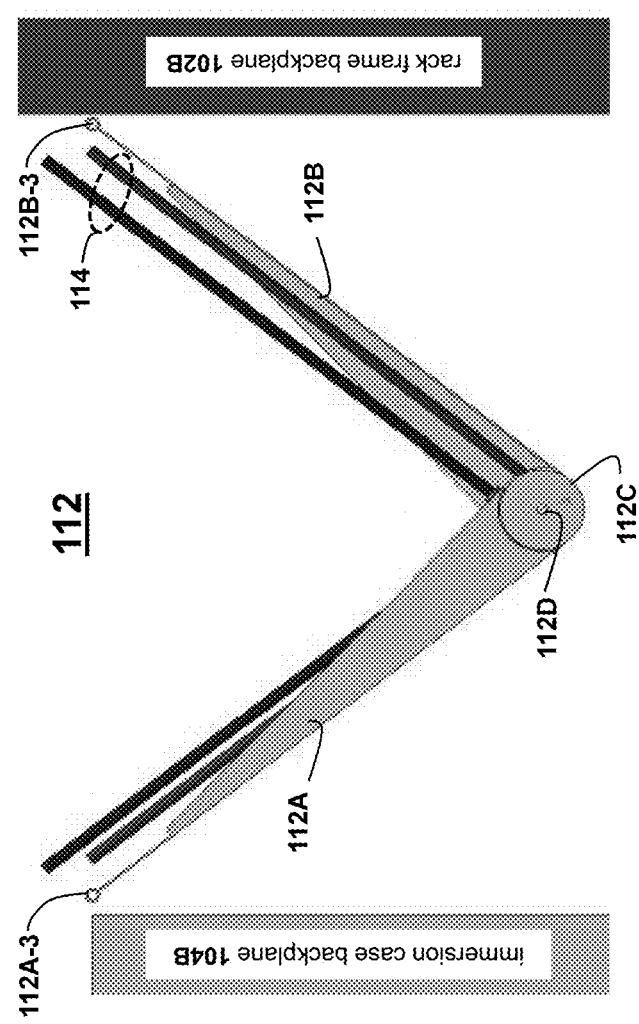
FIG. 3B depicts a side view of the articulating scissor cable/tube management structure in a partial de-racked position, in accordance with the embodiments of the present disclosure.

FIG. 3B depicts a side view of the articulating scissor cable/tube structure 112 for an immersion case 104 in a partially de-racked position, in accordance with the embodiments of the present disclosure. As shown, articulating scissor cable/tube structure 112 comprises first arm 112A, second arm 112B, and joining portion 112C containing center axle 112D. By providing a central pivot point, joining portion 112C is configured to couple first arm 112A and second arm 112B together while enabling arms 112A, 112B to rotatably move in an articulating vertical manner relative to each other, as immersion case 104 is moved between the racked and de-racked positions. As will be discussed in further detail below, the joining portion 112C is further configured to controllably guide the cable/tube bundle 114 around the pivot point during the movement of de-racking and racking operations to at least maintain required flow rates of the circulated cooled channelized fluid flowing through the tubes of the cable/tube bundle 114.

The articulating scissor cable/tube structure 112 is designed to operate in a "scissor-like" manner, in which arms 112A, 112B are configured to be capable of laterally extending outwardly apart from each other and causing joining portion 112C to articulate in a vertically upward direction during de-racking operations. Commensurately during racking operations, arms 112A, 112B are also configured to be capable of laterally contracting inwardly towards each other and causing joining portion 112C to articulate in a vertically downward direction.

As depicted by FIG. 3B, first arm 112A incorporates a fastener 112A-3 disposed at a top portion thereof and is configured to detachably connect to or mate with the immersion case backplane 104B (i.e., contact point 116). The second arm 112B incorporates a fastener 112B-3 disposed at a top portion thereof and is configured to detachably connect to or mate with the rack frame backplane 102B (i.e., contact point 118). The fasteners 112A-3, 112B-3 may comprise a hook, catch, clasp, latch, clip, grommet, snap or other suitable components that may be easily attached to, and easily be detached from, the respective immersion case backplane contact point 116 and rack frame backplane contact point 118.

Returning to FIGS. 1A, 1B, while the immersion case 104 is in the racked position, articulating scissor cable/tube structure 112 supports and guides cable/tube bundle 114 into the fixed racked space. Specifically, during racking operations, first arm 112A of articulating scissor cable/tube structure 112 that is engaged with immersion case backplane contact point 116 via fastener 112A-3 is urged towards second arm 112B that is engaged with rack frame backplane contact point 118 via fastener 112B-3. As a result, joining portion 112C articulates in a vertically downward direction to contract the lateral distance between the backplanes 102B, 104B of the corresponding immersion case 104 and rack frame 102 to support and orderly guide cable/tube bundle 114 into the fixed racked space.

FIGS. 2A and 2B depict a cross-sectional view and perspective view, respectively, of a rack-mounted immersion case in a de-racked position serviced by the articulating scissor cable/tube management structure, in accordance with the embodiments of the present disclosure. The de-racked position of immersion case 104 applies during, for example, maintenance, repair, testing, etc. procedures. Because FIGS. 2A, 2B illustrate the same structural features as FIGS. 1A, 1B, identical reference characters are used and the previous descriptions of such features and attributes are omitted for purposes of brevity.

As depicted by FIGS. 2A, 2B, in the de-racked position, immersion case 104 is slidably extracted from rack frame 102. In the de-racked position, the lateral distance spacing between the immersion case backplane 104B and the rack frame backplane 102B defines an adjustable de-racked space that is larger than the racked space. That is, the variability of the lateral distance spacing of the de-racked space is directly related to the extent to which immersion case 104 is slidably extracted from rack frame 102.

As discussed above, articulating scissor cable/tube structure 112 is designed to operate in a "scissor-like" manner. Therefore, for de-racking operations, first arm 112A of articulating scissor cable/tube structure 112 that is engaged with immersion case backplane contact point 116 via fastener 112A-3 is drawn separately away from second arm 112B that is commensurately engaged with rack frame backplane contact point 118 via fastener 112B-3. As a result, joining portion 112C articulates in a vertically upward direction to extend the lateral distance spacing between the backplanes 104B, 102B of the respective immersion case 104 and rack frame 102 to support and orderly guide cable/tube bundle 114 across the adjustable de-racked space.

In the event that an immersion case 104 has to be completely removed from rack frame 102 due to, for example, equipment malfunction/failure, upgrade replacement etc., by virtue of detachable fasteners 112A-3, 112B-3 articulating scissor cable/tube structure 112 is capable of conveniently disengaging from either the backplane of the corresponding immersion case 104 or from the backplane 102B of rack frame 102.

Figure 4:
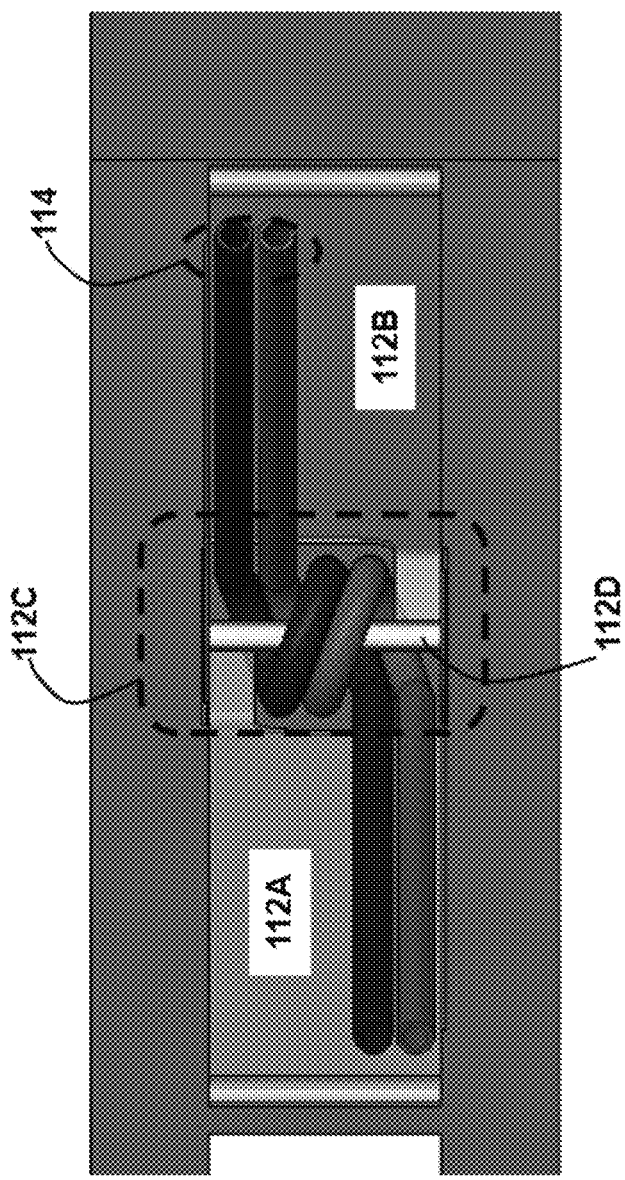
FIG. 4 depicts a joining portion pivot point control configuration of the cable/tube bundle, in accordance with various embodiments of the present disclosure.
Figure 5:
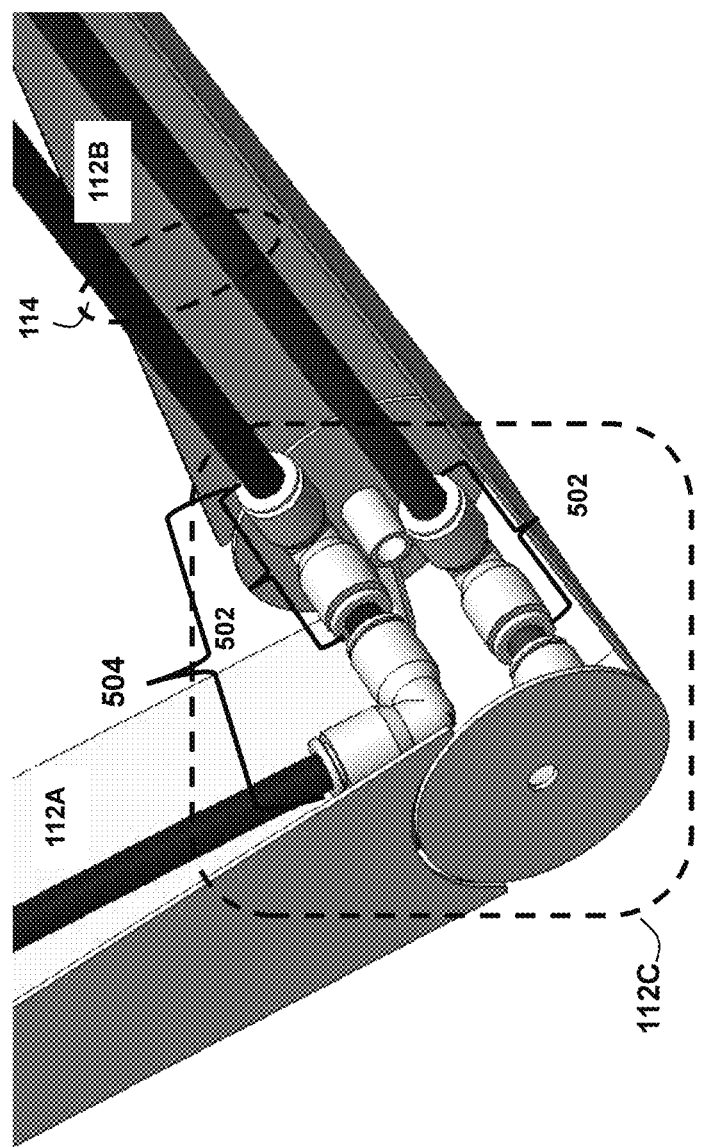
FIG. 5 depicts a joining portion pivot point control configuration of the cable/tube bundle, in accordance with various embodiments of the present disclosure.
Figure 6:
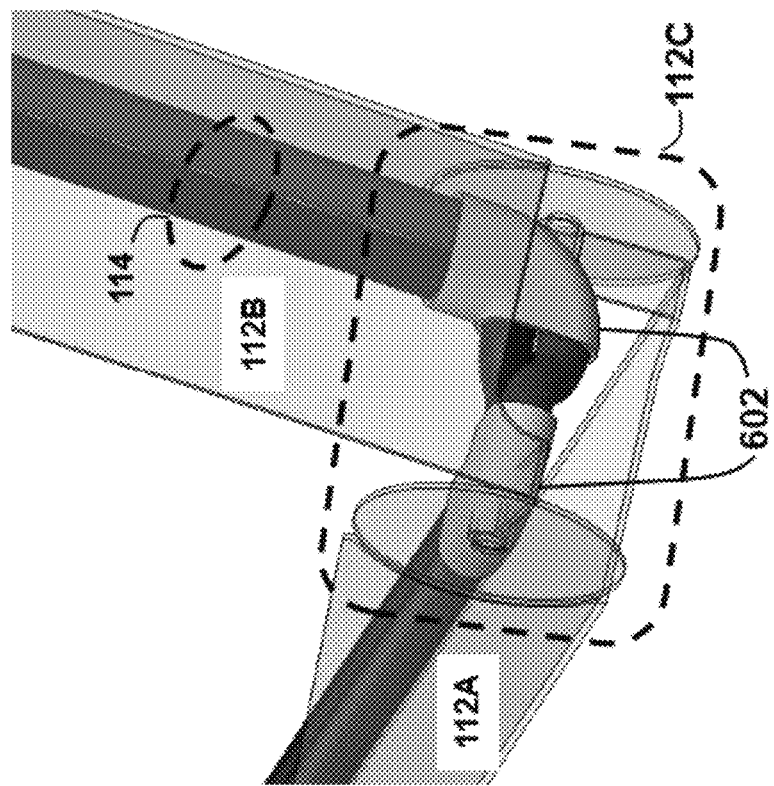
FIG. 6 depicts a joining portion pivot point control configuration of the cable/tube bundle, in accordance with various embodiments of the present disclosure.

As noted above, joining portion 112C is further configured to controllably guide the cable/tube bundle 114 around the joining portion 112C pivot point during the movement of de-racking and racking operations. To this end, FIGS. 4-6 depict joining portion 112C pivot point control configurations of the cable/tube bundle 114, in accordance with various embodiments of the present disclosure. For purposes of clarity and tractability, some features of the joining portion 112C and cable/tube bundle 114 have been omitted from the figures and the descriptions will focus on the tubes of cable/tube bundle 114 that service circulated channelized fluid flowing therethrough with the understanding that such descriptions equally apply to the cables of cable/tube bundle 114.

Accordingly, FIG. 4 depicts a configuration of joining portion 112C embodiment that controllably guides the cable/tube bundle 114 around the joining portion 112C pivot point. As shown, joining portion 112C provides an arrangement that enables the cable/tube bundle 114 to orderly loop and wrap around center axle 112D.

In this arrangement, the loop of cable/tube bundle 114 that is wrapped around center axle 112D is arranged to have sufficient space and flexibility to enable the various movements of the immersion case 104 during de-racking and racking operations of the cable/tube bundle 114. This arrangement also prevents any unwanted bending or crimping in order to maintain the required flow rates of the circulated cooled channelized fluid flowing through the tubes of bundle 114 during de-racking and racking operation movements.

FIG. 5 depicts another joining portion 112C control configuration embodiment of the cable/tube bundle 114 that controllably guides the cable/tube bundle 114 around the joining portion 112C pivot point. As shown, joining portion 112C control configuration incorporates rotatable coupling element pairs 504 to service cable/tube bundle 114 around the 112C pivot point to facilitate the movement of de-racking and racking operations.

Specifically, joining portion 112C control configuration incorporates rotatable coupling element pairs 504, disposed in close proximity to center axle 112D. Each of the individual rotatable coupling elements 502 of pairs 504 manifest an elbow or "L-shaped" profile having a first end and perpendicularly-oriented second end, in which each of the first and second ends comprise sealed, rotatable, pressure-fitted connections, such as, for example, hydraulic fittings, pneumatic fittings, or any similar coupling fittings.

As shown, each rotatable coupling element pair 504 is arranged to service an individual tube of the cable/tube bundle 114. In this arrangement, a first end of a first coupling element 502 of the pair 504 fittingly connects to a tube that is routed from the rack frame backplane 102B. A rotatable second end of the first coupling element 502 is configured to interact with a rotatable second end of a second coupling element 502 of the respective pair 504. In turn, a first end of the second coupling element 502 is fittingly connected to the tube that is routed towards the immersion case backplane 104B.

In implementation, portions of the coupling elements 502 may be attached to a respective arm 112A, 112B of the scissor cable/tube structure 112 or rotatably attached to center axle 112D.

By this arrangement, each rotatable coupling element pair 504 servicing a tube of cable/tube bundle 114 facilitates the movement during de-racking and racking operations by employing coupling elements 502 that controllably allow for rotations in response to the various movements caused by such operations. In so doing, this arrangement prevents any unwanted bending or crimping in order to maintain the required flow rates of the circulated cooled channelized fluid flowing through the tubes of bundle 114 during de-racking and racking operations movement.

FIG. 6 depicts a further joining portion 112C control configuration embodiment of the cable/tube bundle 114. As shown, joining portion 112C control configuration incorporates a pair of flexible restraint fittings 602 to service cable/tube bundle 114 around the 112C pivot point to facilitate the movement of de-racking and racking operations.

Specifically, joining portion 112C control configuration incorporates a pair of flexible strain-relief fittings 602, disposed in close proximity to center axle 112D. Each of the individual flexible strain-relief fittings 602 manifest an elbow or "L-shaped" profile having a first end and a perpendicularly-oriented second end. The flexible strain-relief fittings 602 comprise a flexible, materials capable of accommodating for the contraction, extension, and twisting movements of the one or more tubes serviced by fittings 602.

As shown, each flexible strain-relief fitting 602 is arranged to service one or more tubes of cable/tube bundle 114. In this arrangement, a first end of a first flexible strain-relief fitting 602 is configured to receive one or more tubes of cable/tube bundle 114 routed from the rack frame backplane 102B. A second end of the first fitting 602 is configured to perpendicularly orient the one or more tubes in order to guide the one or more tubes to a complementary second end of a second flexible strain-relief fitting 602. In turn, the second end of the second flexible strain-relief fitting 602 is configured to receive the one or more tubes and perpendicularly reorient the received one or more tubes for routing towards the immersion case backplane 104B.

In implementation, the strain-relief fittings 602 may be attached to a respective arm 112A, 112B of the scissor cable/tube structure 112, the strain-relief fittings 602 may be rotatably attached to center axle 112D and/or the strain-relief fittings 602 may be wrapped around center axle 112D.

By this arrangement, each of the flexible strain-relief fittings 602, servicing one or more tubes of cable/tube bundle 114, facilitates the various movements during de-racking and racking operations by employing pliable, flexible components that controllably allows for the various contraction, extension, and twisting movements of the one or more tubes during such operations. In so doing, this arrangement prevents any unwanted bending or crimping in order to maintain the required flow rates of the circulated cooled channelized fluid flowing through the tubes of bundle 114 during de-racking and racking operations.

With this said, it should be understood that, although the embodiments presented herein have been described with reference to specific features and structures, various modifications and combinations may be made without departing from the underlying concepts and principles taught by these disclosures. As such, the specification and drawings are to be regarded as providing edifying guidance as to the underlying concepts and principles presented by the implementations and embodiments.

Accordingly, the scope encompassed by the underlying concepts and principles presented by the disclosed implementations and embodiments is defined by the appended claims, and are contemplated to cover any and all modifications, variations, combinations or equivalents that fall within the scope of the present disclosure.

What is claimed is:

1. A rack system for housing at least one rack-mounted, liquid-cooled case containing at least one electronic assembly, comprising:
a rack frame configured to receive the at least one of liquid-cooled case within the rack system;
an opening within the rack frame configured to accommodate at least one cable/tube bundle for servicing the at least one liquid-cooled case within the rack system when the at least one liquid-cooled case is installed in the rack system; and
at least one articulating scissor structure comprising a first arm having a top portion with a fastener configured to be detachably coupled to a contact point of the at least one liquid-cooled case backplane, a second arm having a top portion with a fastener detachably coupled to a contact point of the rack frame backplane, and a joining portion hingedly coupling a bottom portion of the first arm and a bottom portion of the second arm together via a center axle,
when in use and the at least one liquid-cooled case is received within the rack system:
the at least one articulating scissor structure being configured to slidably move the at least one liquid-cooled case in racking and de-racking operations, the racking and de-racking operations causing lateral movement of the at least one of liquid-cooled case between a racked space and a de-racked space,
the racked and de-racked spaces being defined between a distal end of the first arm and a backplane of the rack frame, the de-racked space being larger than the racked space,
the joining portion being configured to controllably guide the at least one cable/tube bundle along a pivot point of the center axle during racking and de-racking operations movement,
wherein, the articulating scissor structure is configured to support and guide the at least one cable/tube bundle during de-racking operations movement by laterally extending the first and second arms to accommodate the de-racked space and to support and guide the at least one cable/tube bundle during racking operations movement by laterally contracting the first and second arms to accommodate the racked space.

2. The rack system of claim 1, wherein the at least one cable/tube bundle comprises at least one cable electrically communicating with one or more components of the at least one electronic assembly and at least one tube conveying channelized liquid to one or more components of the at least one electronic assembly.

3. The rack system of claim 1, wherein each of the first and second arms of the at least one articulating scissor structure comprises a flat surface portion and a retaining sidewall portion, the flat surface and retaining sidewall portions of the respective first and second arms configured to complement each other to enable the joining portion to hingedly couple the first and second arms.

4. The rack system of claim 1, wherein each of the first arm fastener and the second arm fastener comprises a structure selected from the group consisting of: a hook, catch, clasp, latch, clip, grommet, and snap or any combination thereof.

5. The rack system of claim 1, wherein each of the at least one liquid-cooled case backplane contact point and the rack frame backplane contact point comprises a structure selected from the group consisting of: a protrusion, stud, stem, and hole or any combination thereof.

6. The rack system of claim 1, wherein the joining portion of the at least one articulating scissor structure controllably guides the at least one cable/tube bundle along a pivot point of the center axle during racking and de-racking operations movement by arranging the cable/tube bundle to loop around the center axle.

7. The rack system of claim 1, wherein the joining portion of the at least one articulating scissor structure controllably guides the at least one cable/tube bundle along a pivot point of the center axle during racking and de-racking operations movement by:
incorporating, proximate to the center axle, first rotatable coupling elements connecting to a segment of the cable/tube bundle routed from the rack frame backplane that are configured to communicate with second rotatable coupling elements connecting to a segment of the cable/tube bundle routed to the distal end of the first arm.

8. The rack system of claim 7, wherein each of the first and second rotatable coupling elements comprises an elbow shape and contains respective end openings configured to provide rotatable, sealed, pressure-fitted connections to the respective segments of the cable/tube bundle.

9. The rack system of claim 7, wherein portions of the first and second rotatable coupling elements are attached to a respective first or second arm of the scissor cable/tube structure or rotatably attached to the center axle.

10. The rack system of claim 1, wherein the joining portion of the at least one articulating scissor structure includes a flexible spring structure configured to bias the first and second arms towards each other or to bias the first and second arms away from each other.

11. The rack system of claim 1, wherein the at least one liquid-cooled case contains:
a volume of immersion dielectric cooling liquid for submerging the at least one electronic assembly therein;
a serpentine convection coil configured to convey cooled channelized liquid to reduce ambient temperatures of the immersion dielectric cooling liquid; and
a closed-loop cooled liquid distribution arrangement configured to distribute channelized cooled liquid to one or more select components of the at least one electronic assembly.

12. An articulating scissor structure for managing a cable/tube bundle that electrically and fluidly communicates with a liquid-cooled case containing an electronic assembly that is mounted within a rack frame, the articulating scissor structure comprising:
a first arm configured to be detachably connected to a contact point on a backplane of the at least one liquid-cooled case and to supportively guide a segment of the cable/tube bundle routed towards a distal end of the first arm;
a second arm configured to be detachably connected to a contact point on a backplane of the rack frame to supportively guide a segment of the cable/tube bundle routed from the rack frame; and
a joining portion configured to hingedly couple the first and second arms via a center axle and to controllably guide the cable/tube bundle along a pivot point of the center axle during a racking operation moving the at least one liquid-cooled case into a racked space within the rack frame and during a de-racking operation moving the at least one liquid-cooled case into a de-racked space away the rack frame,
wherein the racked and de-racked spaces are defined between the distal end of the first arm and the rack frame backplane, in which the de-racked space is larger than the racked space,
the joining portion being configured to controllably guide the cable/tube bundle by incorporating, proximate to the center axle, a first strain-relief fitting connecting to a segment of the cable/tube bundle routed from the rack frame backplane and a second strain-relief fitting connecting to a segment of the cable/tube bundle routed to the distal end of the first arm.

13. The articulating scissor structure of claim 12, wherein each of the first and second arms of the articulating scissor structure comprises a flat surface portion and a retaining sidewall portion, the flat surface and retaining sidewall portions of the respective first and second arms configured to complement each other to enable the joining portion to hingedly couple the first and second arms.

14. The articulating scissor structure of claim 12, wherein the joining portion of the articulating scissor structure controllably guides the cable/tube bundle along a pivot point of the center axle during racking and de-racking operations movement by arranging the cable/tube bundle to loop around the center axle.

15. The articulating scissor structure of claim 12, wherein the joining portion of the articulating scissor structure controllably guides the cable/tube bundle along a pivot point of the center axle during racking and de-racking operations movement by:
incorporating, proximate to the center axle, first rotatable coupling elements connecting to a segment of the cable/tube bundle routed from the rack frame backplane that are configured to communicate with second rotatable coupling elements connecting to a segment of the cable/tube bundle routed to the distal end of the first arm.

16. A rack system for housing at least one rack-mounted, liquid-cooled case containing at least one electronic assembly, comprising:
a rack frame configured to receive the at least one of liquid-cooled case within the rack system;
an opening within the rack frame configured to accommodate at least one cable/tube bundle for servicing the at least one liquid-cooled case within the rack system when the at least one liquid-cooled case is installed in the rack system; and
at least one articulating scissor structure comprising a first arm having a top portion with a fastener configured to be detachably coupled to a contact point of the at least one liquid-cooled case backplane, a second arm having a top portion with a fastener detachably coupled to a contact point of the rack frame backplane, and a joining portion hingedly coupling a bottom portion of the first arm and a bottom portion of the second arm together via a center axle,
when in use and the at least one liquid-cooled case is received within the rack system:
the at least one articulating scissor structure being configured to slidably move the at least one liquid-cooled case in racking and de-racking operations, the racking and de-racking operations causing lateral movement of the at least one of liquid-cooled case between a racked space and a de-racked space,
the racked and de-racked spaces being defined between a distal end of the first arm and a backplane of the rack frame, the de-racked space being larger than the racked space,
the joining portion being configured to controllably guide the at least one cable/tube bundle along a pivot point of the center axle during racking and de-racking operations movement by incorporating, proximate to the center axle, a first strain-relief fitting connecting to a segment of the cable/tube bundle routed from the rack frame backplane and a second strain-relief fitting connecting to a segment of the cable/tube bundle routed to the distal end of the first arm,
wherein, the articulating scissor structure is configured to support and guide the at least one cable/tube bundle during de-racking operations movement by laterally extending the first and second arms to accommodate the de-racked space and to support and guide the at least one cable/tube bundle during racking operations movement by laterally contracting the first and second arms to accommodate the racked space.

17. The rack system of claim 16, wherein each of the first and second strain-relief fittings comprises a flexible material to accommodate for rotating or twisting movements during racking and de-racking operations.

18. The rack system of claim 16, wherein portions of the first and second strain-relief fittings are attached to a respective first or second arm of the scissor cable/tube structure or rotatably attached to the center axle.

* * * * *